United States Patent
Liu et al.

(10) Patent No.: US 9,739,802 B2
(45) Date of Patent: Aug. 22, 2017

(54) MULTI-ELECTRODE CONDUCTIVE PROBE, MANUFACTURING METHOD OF INSULATING TRENCHES AND MEASUREMENT METHOD USING MULTI-ELECTRODE CONDUCTIVE PROBE

(71) Applicant: NATIONAL CHENG KUNG UNIVERSITY, Tainan (TW)

(72) Inventors: Bernard Haochih Liu, Tainan (TW); Chun-Chieh Tien, Kaohsiung (TW); Jui-Teng Cheng, New Taipei (TW); Yu-Lun Cheng, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 224 days.

(21) Appl. No.: 14/581,771

(22) Filed: Dec. 23, 2014

(65) Prior Publication Data
US 2015/0192617 A1     Jul. 9, 2015

(30) Foreign Application Priority Data
Jan. 3, 2014   (TW) .............................. 103100284 A

(51) Int. Cl.
| | |
|---|---|
| *G01R 1/073* | (2006.01) |
| *G01R 1/067* | (2006.01) |
| *G01R 31/02* | (2006.01) |
| *H01L 23/48* | (2006.01) |
| *G01R 3/00* | (2006.01) |

(52) U.S. Cl.
CPC ............... *G01R 3/00* (2013.01); *G01R 1/067* (2013.01); *G01R 1/06744* (2013.01)

(58) Field of Classification Search
CPC .. G01R 3/00; G01R 1/07307; G01R 1/07314; G01R 1/06738; G01R 1/06711; G01R 1/067; G01R 1/06727; G01R 1/073; G01R 31/02; H01L 23/48; H01L 23/4952
USPC .... 324/755.01, 755.07, 149, 754.03, 754.07, 324/754.18; 850/40, 60, 32, 33, 41; 29/846
See application file for complete search history.

(56) References Cited

U.S. PATENT DOCUMENTS

| | | | |
|---|---|---|---|
| 2002/0008530 A1* | 1/2002 | Kim ................... | G01R 1/06727 324/755.07 |
| 2002/0153911 A1* | 10/2002 | Cho ........................ | G01R 3/00 324/755.07 |

FOREIGN PATENT DOCUMENTS

TW            200513789 A      4/2005

* cited by examiner

*Primary Examiner* — Son Le
*Assistant Examiner* — Neel Shah
(74) *Attorney, Agent, or Firm* — Muncy, Geissler, Olds & Lowe, P.C.

(57) ABSTRACT

A multi-electrode conductive probe, a manufacturing method of insulating trenches and a measurement method using the multi-electrode conductive probe are disclosed. The conductive probe includes a base, a plurality of support elements, a plurality of tips and a conductive layer. The base has a surface and a plurality of protrusions. The protrusions are configured on the surface in a spacing manner, and an insulating trench is disposed between the two adjacent protrusions. The support elements are disposed at the base and protrude from the base. The tips are disposed on the end of the support elements away from the base. The conductive layer covers the surface of the base, the protrusions, the support elements and the tips. Portions of the conductive layer on the two adjacent support elements are electrically insulated from each other by at least an insulating trench.

10 Claims, 17 Drawing Sheets

: Si$_3$N$_4$

: Tic

: glassy phase

--- : current path

US 9,739,802 B2

MULTI-ELECTRODE CONDUCTIVE PROBE, MANUFACTURING METHOD OF INSULATING TRENCHES AND MEASUREMENT METHOD USING MULTI-ELECTRODE CONDUCTIVE PROBE

CROSS REFERENCE TO RELATED APPLICATIONS

This Non-provisional application claims priority under 35 U.S.C. §119(a) on Patent Application No(s). 103100284 filed in Taiwan, Republic of China on Jan. 3, 2014, the entire contents of which are hereby incorporated by reference.

BACKGROUND OF THE INVENTION

Field of Invention

The invention relates to a conductive probe, a manufacturing method of insulating trenches and a measurement method using the conductive probe and, in particular, to a multi-electrode conductive probe, a manufacturing method of insulating trenches and a measurement method using the multi-electrode conductive probe.

Related Art

Atomic force microscopy (AFM) (or called scanning probe microscopy, SPM) refers to the microscopy equipped with a scanning mechanism and operation and a microprobe mechanism, already becoming an important appliance for nanotechnology and biomedical research.

FIG. 1 is a schematic diagram of a scanning probe used to detect a surface of an under-test object in the conventional art. When the surface of an under-test object 91 is scanned by the probe 92, a light emitting element 93 emits a light beam (such as a laser beam) to irradiate a cantilever 921 of the probe 92 and the light beam is reflected to be received by the photo sensing element 94 (e.g. a photo diode). The control feedback circuit 95 receives the signal converted by the photo sensing element 94 and then controls a scanning mechanism 96 to move in order to adjust the position of the under-test object 91, so that a certain interaction between the tip 922 and the surface of the under-test object 91 is kept a constant. Moreover, the trimming data for adjusting the position of the under-test object 91 is just the interaction data of the surface, usually corresponding to the structure shape of the surface of the under-test object 91. Therefore, the improvement of the function of AFM applied to the nanotechnology and biomedical research relies on the design and manufacturing of the novel probe, and that is why the scanning probe is the technical kernel of AFM.

Besides, conductive atomic force microscopy (CAFM) is a technology based on AFM, with a primary feature of using a conductive probe to scan a sample surface. The manufacturing method of the conductive probe is to usually form a conductive coating layer on the tip surface of the scanning probe. Thus, a voltage can be applied to between the probe and the sample during the scanning process, and then the current can flow to the sample through the conductive coating layer on the tip surface. By the application of the current and bias voltage, the electric property of the sample can be analyzed on a nanoscale. Therefore, the scale of the electric property analysis of the material can be improved to the nanoscale, and then the electric property of the sample can be mapped with the surface profile under the assist of the function of profile scanning of AFM. Moreover, by taking advantage of the conductivity of the probe and the adaptability of AFM, the microlithography or local oxidation can be applied to the semiconductor and metal in the atmosphere or organic substance. The chemical reaction or microstructure change will be generated on the sample by the contact of the conductive probe with the sample, so CAFM can be widely applied to any kind of nanostructure machining.

SUMMARY OF THE INVENTION

An objective of the invention is to provide a multi-electrode conductive probe and the manufacturing method of insulating trenches thereof so as to not only decrease the number of the masks used in the manufacturing of the conductive probe but also simplify the manufacturing process and reduce the production cost.

Another objective of the invention is to provide a measurement method using a multi-electrode conductive probe which not only can implement the electric measurement to the surface of the micro-region, but also, more importantly, can increase the applicability of the conductive probe, without only applied to AFM.

To achieve the above objective, a conductive probe according to the invention includes a base, a plurality of support elements, a plurality of tips and a conductive layer. The base has a surface and a plurality of protrusions. The protrusions are configured on the surface in a spacing manner, and an insulating trench is disposed between the two adjacent protrusions. The support elements are disposed at the base and protrude from the base. The tips are disposed on the end of the support elements away from the base. The conductive layer covers the surface of the base, the protrusions, the support elements and the tips. Portions of the conductive layer on the two adjacent support elements are electrically insulated from each other by at least an insulating trench.

To achieve the above objective, a manufacturing method of an insulating trench of a conductive probe according to the invention comprises steps of: providing a base; forming a buffer layer on the base; forming a mask layer on the buffer layer; patterning the mask layer and the buffer layer; and implementing an etching process to form an insulating trench between the two adjacent structures of the patterned mask layer and buffer layer.

In one embodiment, the conductive layer covers a bottom of each of the insulating trenches.

In one embodiment, the conductive layer is formed in the same process.

In one embodiment, each of the protrusions protrudes from the base.

In one embodiment, the height of one of the tips is greater than that of another tip.

In one embodiment, one of the support elements is bent towards the direction of the tip in comparison with another support element.

In one embodiment, the sum of the heights of one of the support elements and the tip thereof is greater than that of the another support element and the tip thereof.

In one embodiment, the distance from one of the tips to the base is greater than that from another tip to the base.

In one embodiment, the insulating trench is formed by a dry etching process or a wet etching process.

In one embodiment, the support elements protruding from the base are disposed side by side or in an encircling manner.

In one embodiment, the conductive probe further includes a buffer layer and a mask layer. The buffer layer is disposed on the protrusions and the mask layer is disposed between the buffer layer and the conductive layer.

In one embodiment, the material of the buffer layer contains $SiO_2$.

In one embodiment, the material of the mask layer contains SiNX, SiCX or Ta2O5.

In one embodiment, an undercut effect is generated at the edge of the mask layer during the etching process and the portions of the conductive layer on the support elements are electrically insulated from each other by the insulating trench. The undercut effect can be achieved by using the anisotropy of the etching process.

To achieve the above objective, a measurement method of using a multi-electrode conductive probe is disclosed. The conductive probe includes a base, a plurality of support elements, a plurality of tips and a conductive layer. The base has a surface and a plurality of protrusions. The protrusions are configured on the surface in a spacing manner, and an insulating trench is disposed between the two adjacent protrusions. The support elements are disposed at the base and protrude from the base. The tips are disposed on the end of the support elements away from the base. The conductive layer covers the surface of the base, the protrusions, the support elements and the tips. Portions of the conductive layer on the two adjacent support elements are electrically insulated from each other by at least an insulating trench. The measurement method comprises steps of: providing an under-test object; scanning a surface of the under-test object by one of the tips to locate a measurement position; moving the conductive probe so as to make at least two of the tips contact the measurement position; and measuring the measurement position through the at least two tips contacting the surface of the under-test object.

In one embodiment, the measurement method further comprises a step of implementing a surface treatment to the under-test object.

In one embodiment, in the step of locating the measurement position, the measurement position is located by using the profile, mechanical property or dynamic property of the under-test object.

In one embodiment, in the step of locating the measurement position, the measurement position is located by using the electric fields or conductivities of different materials on the surface of the under-test object.

In one embodiment, in the step of locating the measurement position, one of the tips contacts or intermittently contacts the surface of the under-test object.

In one embodiment, in the step of locating the measurement position, one of the tips doesn't contact the surface of the under-test object.

In one embodiment, the measurement method further comprises a step of applying a voltage difference to the at least two tips contacting the surface of the under-test object.

As mentioned above, in the multi-electrode conductive probe and the manufacturing method of insulating trenches thereof of the invention, the protrusions of the conductive probe are configured on the surface in a spacing manner, and an insulating trench is disposed between the two adjacent protrusions. The conductive layer covers the surface of the base, the protrusions, the support elements and the tips. The portions of the conductive layer on the two adjacent support elements are electrically insulated from each other by at least an insulating trench. Thereby, an additional mask is not required to define the pattern of the conductive layer of the conductive probe of this invention, but the portions of the conductive layer on the tips can be electrically insulated from each other by the insulating trenches. Therefore, through the design of the insulating trenches of this invention, the conductive electrodes can be electrically insulated from each other so that the process scan be simplified and the production yield of the probe can be enhanced, and besides, the number of the masks can be decreased so that the production cost can be reduced.

Furthermore, in the measurement method using the multi-electrode conductive probe of the invention, one of the tips is used to scan the surface of the under-test object to locate the measurement position, at least two of the tips are made contact the measurement position, and the measurement position is measured by the at least two tips contacting the surface of the under-test object. Thereby, this invention not only can implement the electric measurement to the surface of the micro-region, but also, more importantly, can increase the applicability of the conductive probe, without only applied to AFM.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
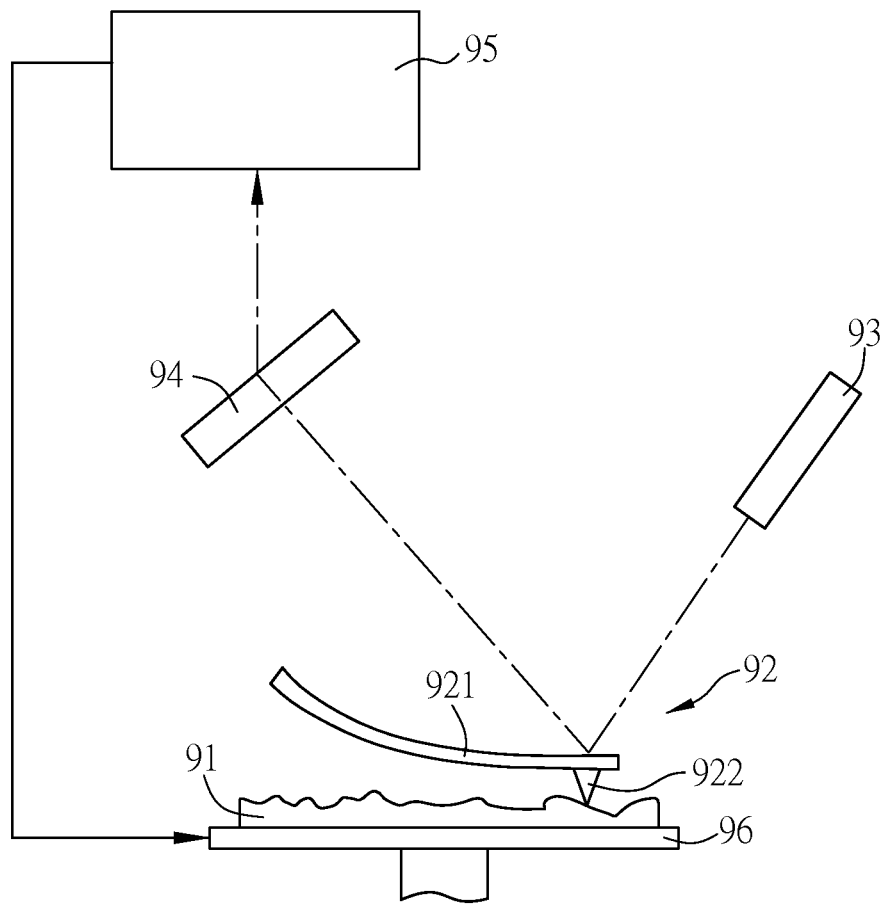
FIG. 1 is a schematic diagram of a scanning probe used to detect a surface of an under-test object in the conventional art.
Figure 2A:
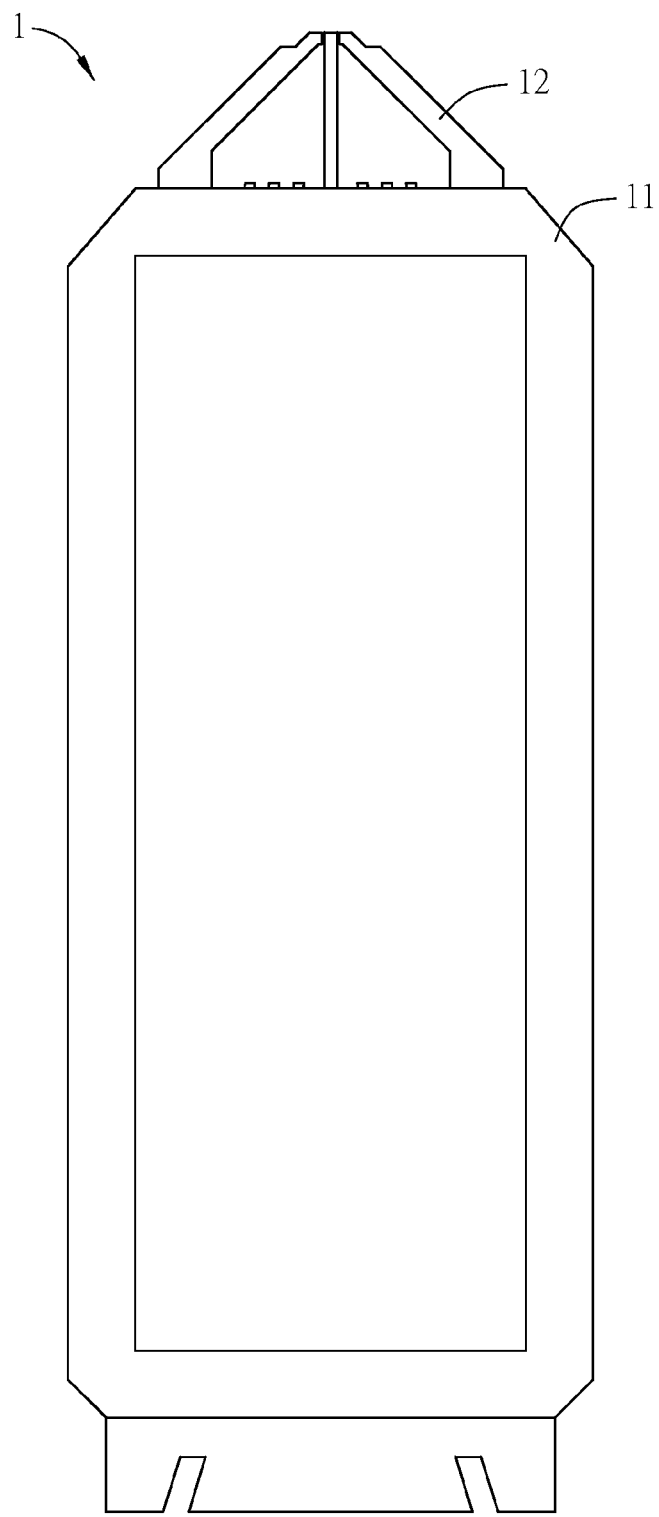
FIGS. 2A and 2B are schematic top-view diagrams of the backside and front of a multi-electrode conductive probe according to an embodiment of the invention, respectively.
Figure 2B:
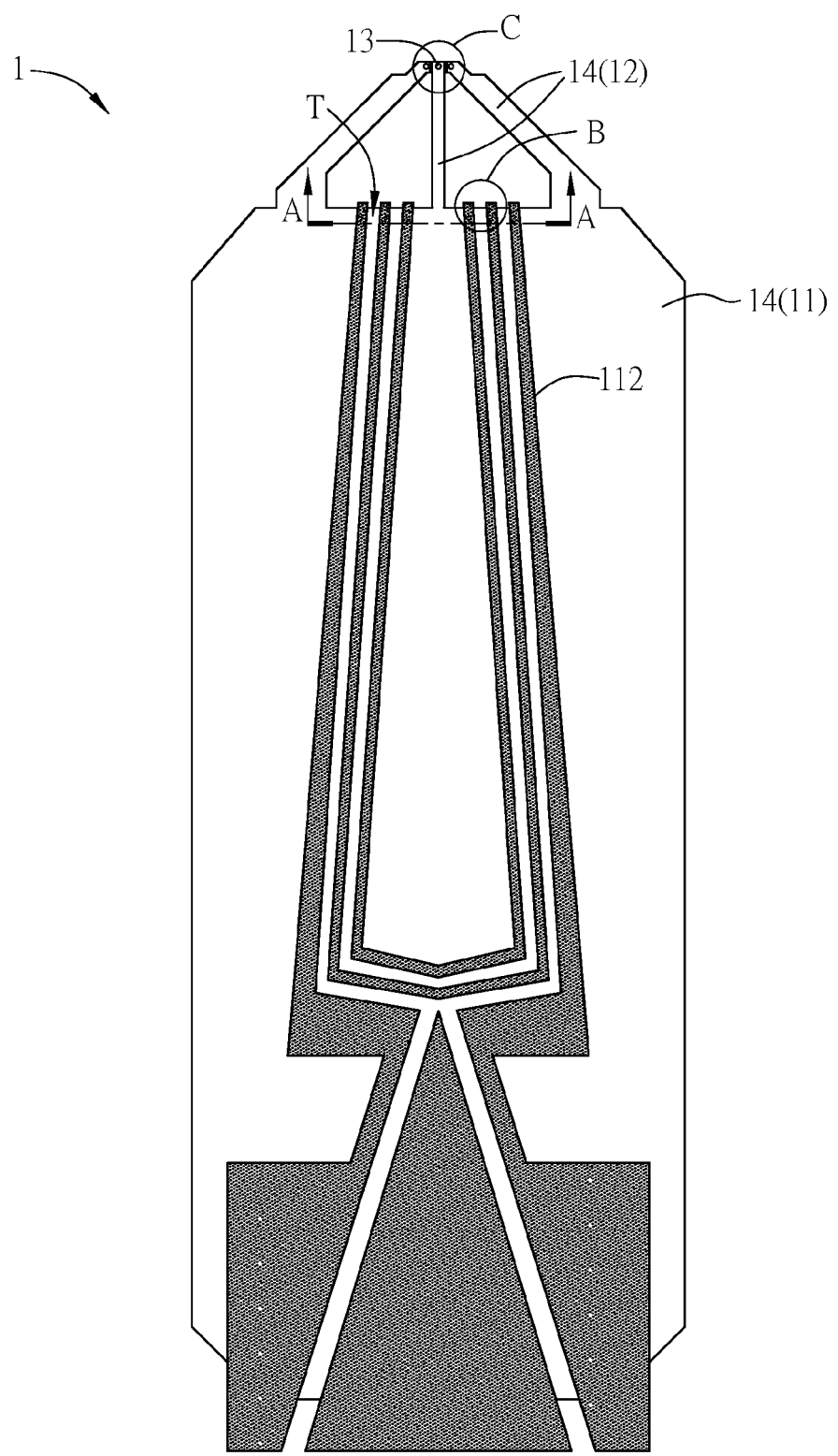
Figure 2C:
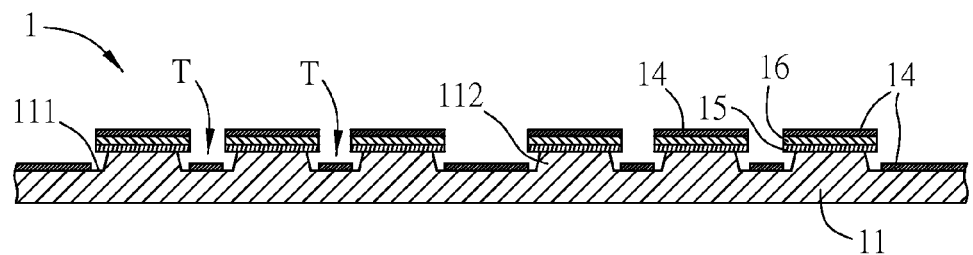
FIG. 2C is a schematic side-view diagram along the line A-A in FIG. 2B.
Figure 2D:
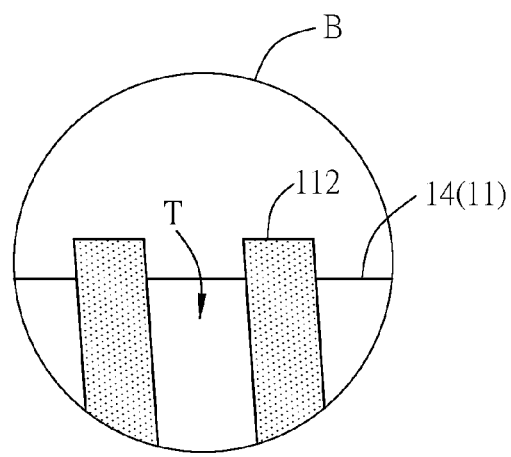
FIGS. 2D and 2E are schematic enlarged diagrams of the regions B, C in FIG. 2B, respectively.
Figure 2E:
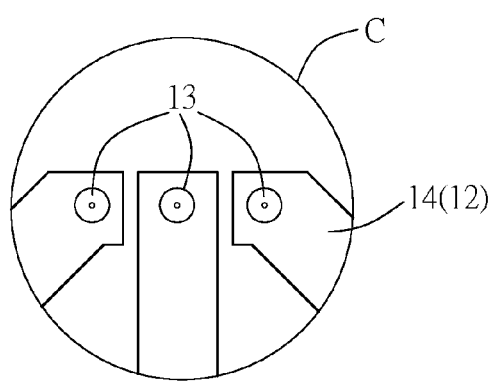

FIGS. 2A and 2B are schematic top-view diagrams of the backside and front of a multi-electrode conductive probe 1 according to an embodiment of the invention, respectively, FIG. 2C is a schematic side-view diagram along the line A-A in FIG. 2B, and FIGS. 2D and 2E are schematic enlarged diagrams of the regions B, C in FIG. 2B, respectively. As shown in FIGS. 2A to 2E, the conductive probe 1 is a multi-electrode conductive probe and can be applied to AFM. However, this invention is not limited to the application of AFM, and in some embodiments, the conductive probe 1 can be applied to the micro-region property measurement. Herein, the "multi-electrode" refers to that the conductive probe 1 includes at least two conductive electrodes electrically insulated from each other.

The conductive probe 1 includes a base 11, a plurality of support elements 12, a plurality of tips 13 and a conductive layer 14. The conductive probe 1 can further include a buffer layer 15 and a mask layer 16. Herein, the buffer layer 15 and the mask layer 16 are not shown in FIGS. 2B and 2D, and the support element 12 and the tip 13 are not shown in FIG. 2C.

As shown in FIGS. 2B and 2C, the base 11 has a surface 111 and a plurality of protrusions 112, and the protrusions 112 are configured on the surface 111 in a spacing manner. Herein, the material of the base 11 can be silicon, and the protrusions 112 can be formed by etching a silicon substrate. An insulating trench T is disposed between the two adjacent protrusions 112 and formed by a dry etching, or a wet etching, or both of a dry etching and a wet etching. In this embodiment, six protrusions 112 are disposed on the base 11 for example, so there are five insulating trenches T. Herein, the widths of the insulating trenches T are unnecessarily the same. The cross-section of the insulating trench T of this embodiment is a trapezoid with a longer upside and a shorter downside. As shown in FIG. 2D, each of the protrusions 112 protrudes from the base 11 to assure the permanent insulating property.

As shown in FIGS. 2B and 2C, the support elements 12 are disposed at the base 11 and protrude from the base 11. The tips 13 are disposed on the end of the support elements 12 away from the base 11. Herein, the support elements 12 and the tips 13 can be both formed by etching. The support elements 12 protruding from the base 11 are disposed side by side or in an encircling manner. In this embodiment, there are three support elements 12 and three tips 13, and the tips 13 are on the ends of the support elements 12 away from the base 11, respectively. Relative to the base 11, the tips 13 are disposed on one end of the support elements 12 side by side (can be called side-by-side tips therefore). Accordingly, the conductive probe 1 is a three-electrode type of conductive probe. The base 11, the support elements 12 and the tips 13 can be integrally formed as one piece. Besides, the required probe scale and tip form can be designed according to the simulation of MEMS (micro electro mechanical systems) and the practical requirements so that the fitted scanning nanometer probe can be produced with uniform quality by using MEMS (micro/nanometer) and etching process.

The conductive layer 14 covers the surface 111 of the base 11, the protrusions 112, the support elements 12 and the tips 13. Herein, the conductive layer 14 can be formed on the base 11, the protrusions 112, the support elements 12 and the tips 13 by an evaporation or sputtering process (which can be replaced by an anisotropic deposition process), and the conductive layer 14 can cover the surface 111 of the base 11, the protrusions 112, the support elements 12 and the tips 13 thereby. Of course, the conductive layer 14 also covers a bottom of each of the insulating trenches T. Therefore, the portions of the conductive layer 14 on the two adjacent support elements 12 are electrically insulated from each other by at least an insulating trench T. Herein, the portions of the conductive layer 14 on the two adjacent support elements 12 are electrically insulated from each other by two insulating trenches T. Moreover, the conductive layer 14 can be a golden coating layer or long-wearing material, such as TiN coating layer or others.

The buffer layer 15 is disposed on the protrusions 112 and directly contacts the protrusions 112, and the mask layer 16 is disposed between the buffer layer 15 and the conductive layer 14. Herein, the material of the buffer layer 15 contains $SiO_2$, and the material of the mask layer 16 contains $SiN_X$, $SiC_X$ or $Ta_2O_5$ for example. The mask layer 16 is an etching mask and a hard mask to define the pattern of the protrusions 112.

In the conventional art to produce the conductive probe, an additional mask will be used to define the pattern of the conductive layer, and this will increase the complexity and cost of the process and also lower down the production yield of the conductive probe. However, the mask is not required to define the pattern of the conductive layer 14 of the conductive probe 1 of this embodiment, and the insulating trenches can provide insulating effect between the conductive layers 14 on the tips 13. Therefore, the insulating trenches T are used in this invention to insulate the conductive electrodes from each other so that the manufacturing process can be simplified, the production yield of the probe can be increased, the number of the masks can be reduced and the production cost of the conductive probe can be lowered down.

FIGS. 3A to 3E are schematic sectional diagrams of the insulating trenches according to different embodiments of the invention, just showing the shape of the insulating trench rather than other components.

Figure 3A:
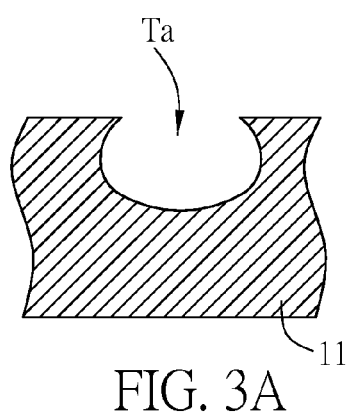
FIGS. 3A to 3E are schematic sectional diagrams of the insulating trenches according to different embodiments of the invention.
Figure 3B:
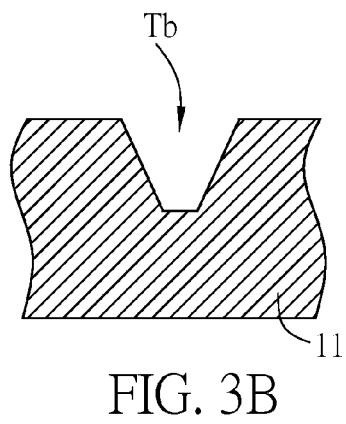
Figure 3C:
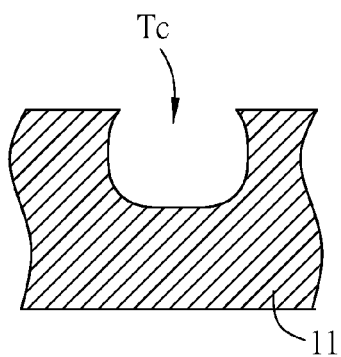
Figure 3D:
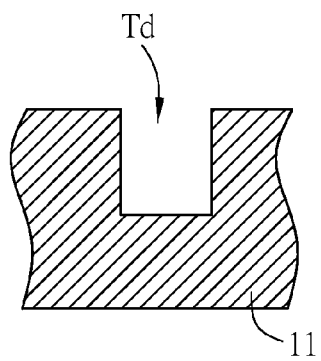
Figure 3E:
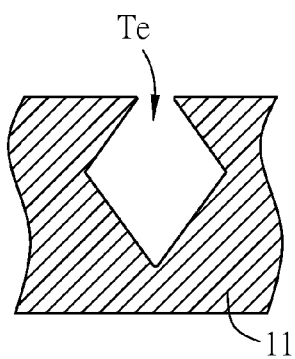

As shown in FIG. 3A, the cross-section of the insulating trench Ta has a curved shape. As shown in FIG. 3B, in comparison with the insulating trench T, the cross-section of the insulating trench Tb is a trapezoid with a different size but still with a longer upside and a shorter downside. As shown in FIG. 3C, in comparison with the insulating trench Ta, the cross-section of the insulating trench Tc has a curved shape with a different curvature. As shown in FIG. 3D, the cross-section of the insulating trench Td is a polygon. As shown in FIG. 3E, the cross-section of the insulating trench Te is a rhombus. The insulating trenches Ta, Tb are formed by wet etching process, the insulating trenches Tc, Td are formed by dry etching process, and the insulating trench Te is formed by wet etching process. The cross-sections of the above insulating trenches are just for the illustration but not for limiting the scope of the invention.

Figure 4:
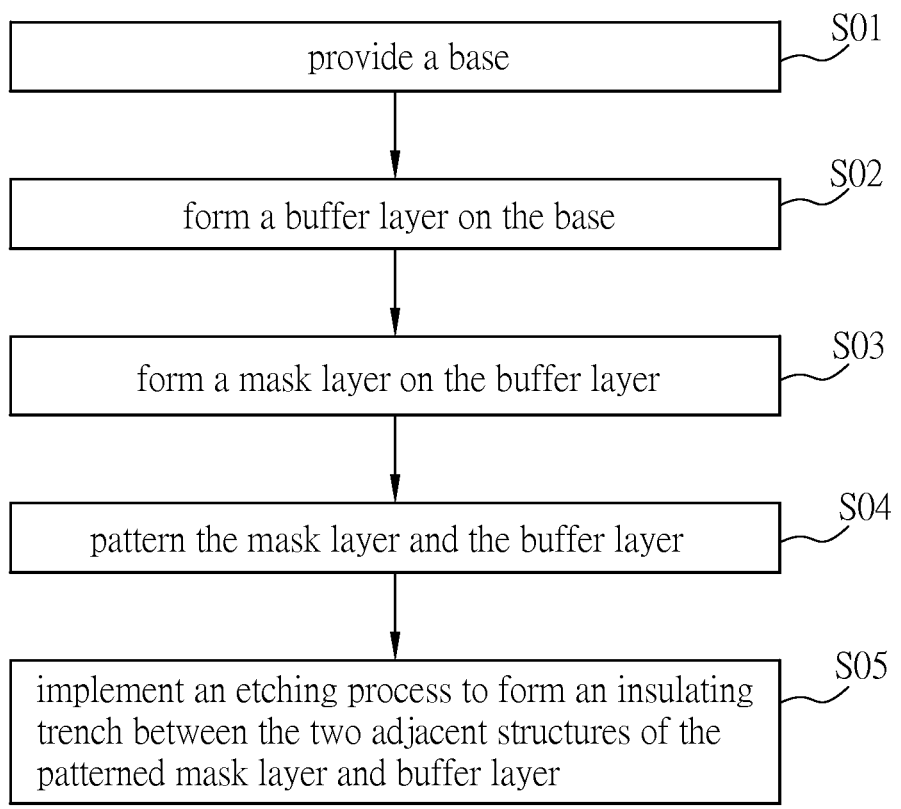
FIG. 4 is a schematic flowchart of the manufacturing method of the insulating trench of the conductive probe in FIG. 2C.

FIG. 4 is a schematic flowchart of the manufacturing method of the insulating trench T of the conductive probe 1 in FIG. 2C, and FIGS. 5A to 5C are schematic diagrams showing the manufacturing process of the insulating trench T in FIG. 2C. Herein, the components included in the conductive probe 1 and the relative relation thereof are illustrated in the above description and are omitted here therefore.

As shown in FIG. 4, the manufacturing method of the insulating trench T of the conductive probe 1 includes the steps S01 to S05.

The step S01 is to provide a base 11. Herein, the base 11 is a silicon substrate.

Figure 5A:
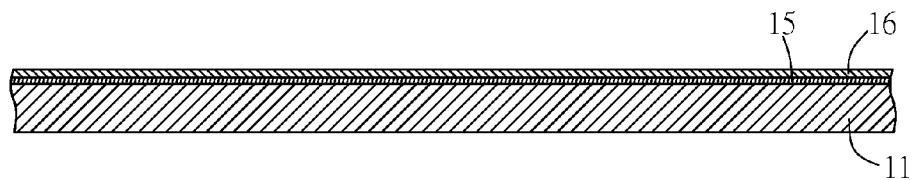
FIGS. 5A to 5C are schematic diagrams showing the manufacturing process of the insulating trench in FIG. 2C.

Then, as shown in FIG. 5A, the step S02 is to form a buffer layer 15 on the base 11 and the step S03 is to form a mask layer 16 on the buffer layer 15. In this embodiment, the material of the buffer layer 15 is SiO2 and the material of the mask layer 16 is SiNX, for example. The buffer layer 15 and the mask layer 16 are sequentially formed on the base 11 by an evaporation or sputtering process for example.

Figure 5B:
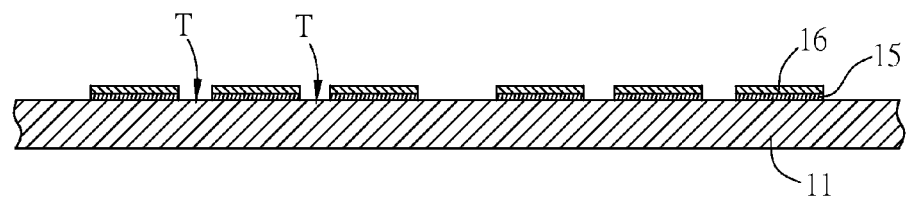

Then, as shown in FIG. 5B, the step S04 is to pattern the mask layer 16 and the buffer layer 15. The step S04 can be implemented by a dry etching process such as inductive coupled plasma (ICP) dry etching or by a wet etching process.

Figure 5C:
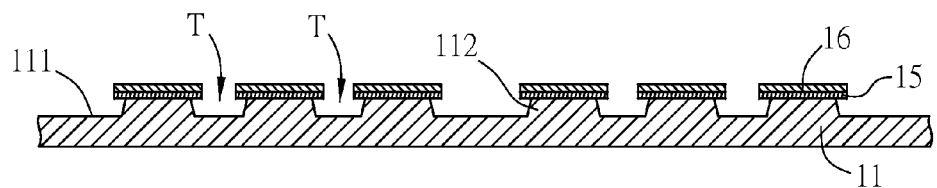

As shown in FIG. 5C, the step S05 is to implement an etching process to form an insulating trench T between the two adjacent structures of the patterned mask layer 16 and buffer layer 15. Herein, the etching process can be a wet etching, a dry etching or the combination of a dry and wet etching. Moreover, the sectional shape of the insulating trench T can be controlled by the control to the parameters of the etching process. In the process, the mask layer 16 is used as the etching mask and is a hard mask, so that an undercut effect is generated at the opposite edges of the mask layer 16 to form the protrusion 112. Then, in the following step of deposit the conductive layer 14, the conductive layer 14 will be naturally broken at the edges of the hard mask (mask layer 16) due to the undercut effect (which can be achieved by using the anisotropy of the etching process). Accordingly, as shown in FIG. 2C, the two adjacent electrodes (conductive layer 14) can be electrically insulated from each other by the insulating trench T. To be noted, in addition to defining the shape of the insulating trenches T, the above-mentioned etching process also can define the support elements 12 and the tips 13.

Figure 6A:
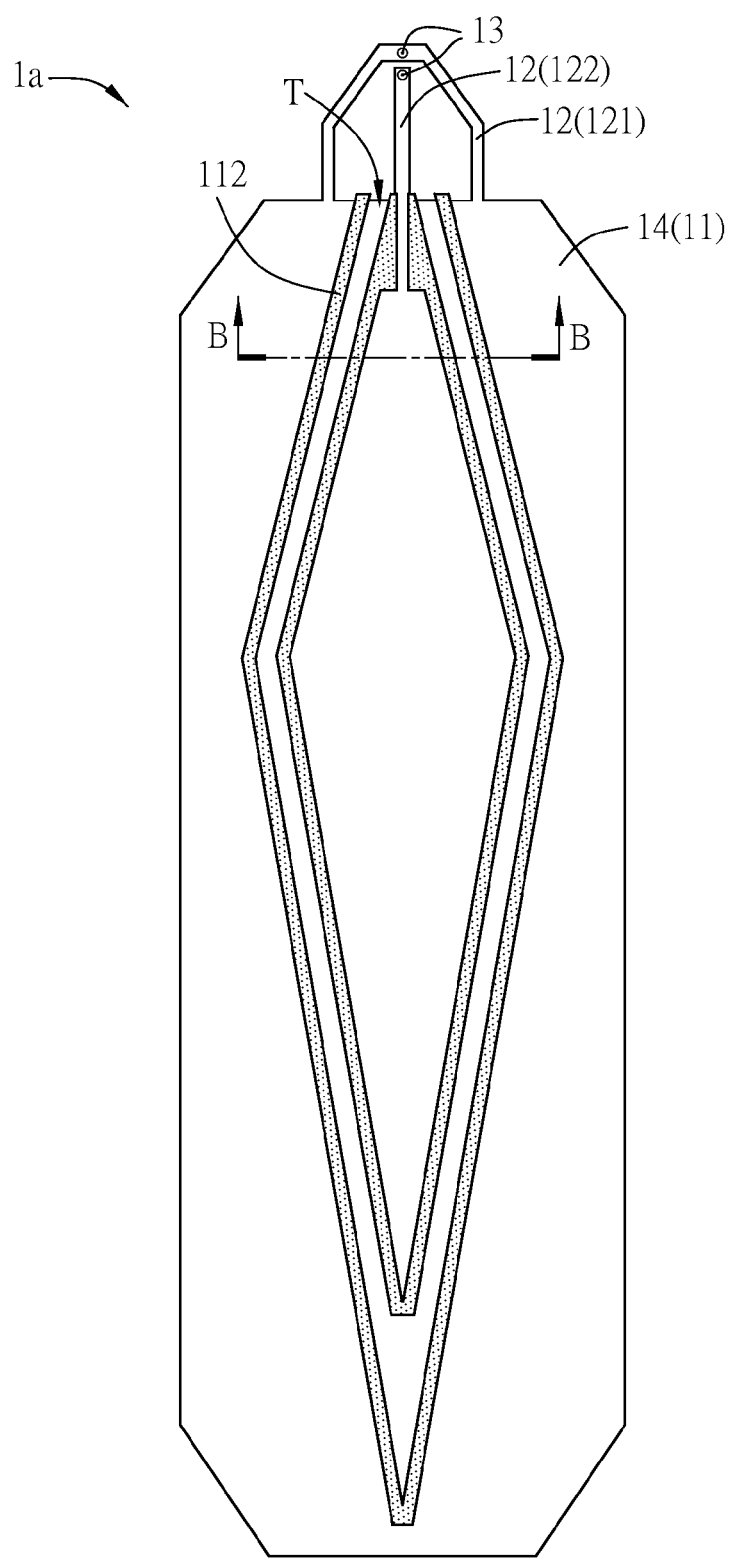
FIG. 6A is a schematic top-view diagram of the front of the conductive probe according to another embodiment of the invention.
Figure 6B:
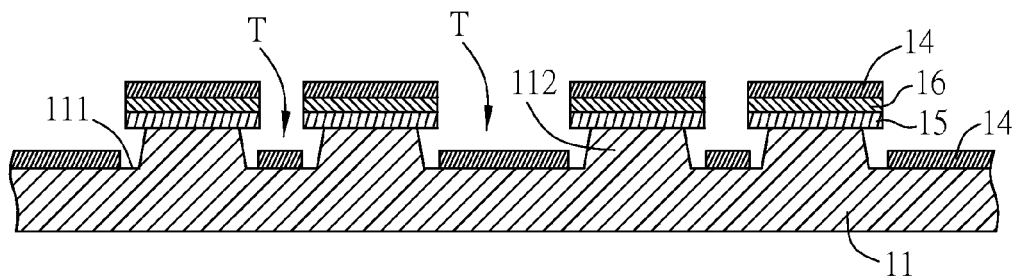
FIG. 6B is a schematic sectional diagram taken along the line B-B in FIG. 6A.

FIG. 6A is a schematic top-view diagram of the front of the conductive probe 1a according to another embodiment of the invention, and FIG. 6B is a schematic sectional diagram taken along the line B-B in FIG. 6A.

The main difference from the conductive probe 1 in FIG. 2B is that the conductive probe 1a is a two-electrode type of conductive probe. The conductive probe 1a includes two support elements 12. One of the support elements 121 protrudes from the base 11 in an encircling manner, and the other 122 protrudes from the base in a straight manner and is disposed within the encircling support element 121. Relative to the base 11, two tips 13 are disposed on the end of the support elements 12 away from the base 11 in a tandem manner (can be called tandem encircling tips therefore). Moreover, four protrusions 112 are disposed on the base 11 of the conductive probe 1a, so there are three insulating trenches T. The technical features of other components of the conductive probe 1a can be comprehended by referring to the conductive probe 1 and are omitted here therefore.

By taking the two-electrode conductive probe 1a of this embodiment as an example, the tip interval between the two tips 13 is about 10 μm~15 μm (can be reduced according to the requirements), the height of the tip 13 is about 4 μm~5 μm (can be controlled during the process), and the tip point of the tip 13 can be formed with a curvature of about 20 nm~40 nm (can be reduced according to the requirements). Moreover, although the above conductive probes 1, 1a are three-electrode conductive probe and two-electrode conductive probe, respectively, the other multi-electrode (e.g. four-electrode, five-electrode, . . . ) conductive probes can be designed and made by those skilled in the art according to the disclosed illustration.

In the conventional art where CAFM is taken as an example, before the electric analysis on the nanoscale or the machining of a particular region or element is implemented, the scan function is usually used to do the first scanning to the sample to determine the correct location of the microstructure or electronic device under test, and then the conductive probe is applied to the location to be analyzed. However, during the first scanning process, the conductive coating layer (such as a golden coating layer) on the surface of the conductive probe is always worn or removed, so that the contact condition between the conductive probe and the sample is uneasily controlled and the subsequent electric analysis is thus distorted and the lifespan of the conductive probe is reduced considerably.

Figure 7A:
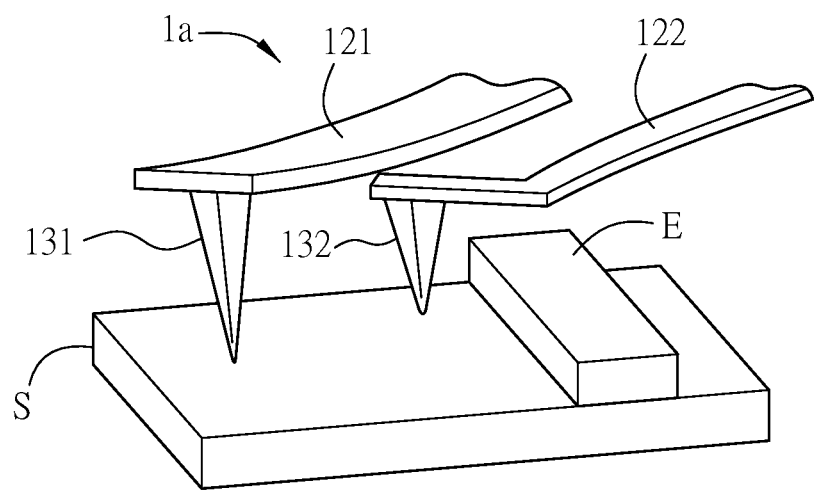
FIGS. 7A and 7B are schematic diagrams showing the conductive probe positioning the sample and the analysis of the probe application.
Figure 7B:
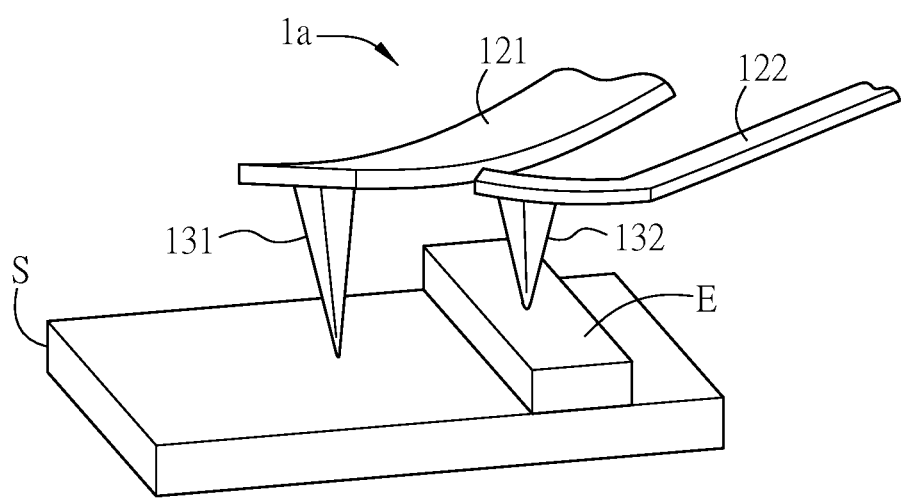

FIGS. 7A and 7B are schematic diagrams showing the multi-electrode conductive probe positioning the sample and the analysis of the probe application. To be noted, FIGS. 7A and 7B are just for the illustration, and the shape and the relative position thereof are not the same as the above-mentioned conductive probes 1, 1a.

As shown in FIGS. 7A and 7B, relative to the base 11 (not shown), the two tips 13 (131, 132) of the conductive probe 1a are disposed on the end of the support elements 12 (121, 122) away from the base 11 in a tandem manner (called tandem encircling tips). Accordingly, one of the tips 131 can be formed with a height greater than the other tip 132 by the control of the process, and the tip 131 on the longer support element 121 can serve as the tip for the first scanning and positioning of the sample S (FIG. 7A). After the first scanning and positioning is completed, because the relative position and the heights of the tips 131, 132 are known, the other tip 132 that is unworn during the first scanning can be used to contact the element E to be analyzed (FIG. 7B) if only the position and force of the probe application are properly adjusted. Thereby, the problem of the influence of the wear of the conductive layer on the electric analysis can be overcome so that the lifespan of the conductive probe 1a can be increased and the accuracy of the electric measuring can be enhanced. Certainly, in the tandem encircling tips, the tip for positioning the probe application and the tip for the electric analysis can be distinguished from each other by that the distance between one of the tips and the base is greater than that between the other tip and the base.

The tip for positioning the probe application and the tip for the electric analysis can be distinguished from each other by the difference between the heights of the tips or the difference between the distances from the tip to the sample, and besides, in the side-by-side tips (as the conductive probe 1), they can be distinguished from each other by the difference of the relative position between the tip and the support element 12. For example, one of the support elements can be controlled as being bent towards the direction of the tip (i.e. towards the direction of the sample), in comparison with the other support elements, or the sum of the heights of one of the support elements and the tip thereof can be controlled as greater than that of the another support element and the tip thereof. Thereby, the tip for positioning the probe application and the tip for the electric analysis also can be distinguished from each other. Accordingly, the unworn tip during the first scanning can be used to contact the element to be analyzed on the sample, and thus the problem of the influence of the wear of the conductive layer on the electric analysis can be overcome so that the lifespan of the conductive probe can be increased and the accuracy of the electric measuring can be enhanced.

In another embodiment, the tips can have the same height, or one of the support elements is not bent towards the direction of the tip in comparison with the other support elements (i.e. the all support elements are the same relative to the base), as long as the conductive layer 14 on the tips 13 is a long-wearing TiN coating layer. Therefore, the lifespan of the probe can be increased, the scanning effect won't be affected even if all (or at least one) tips contact the sample, and the distortion won't be caused during the electric analysis due to the long-wearing coating layer on the conductive probe.

Figure 8:
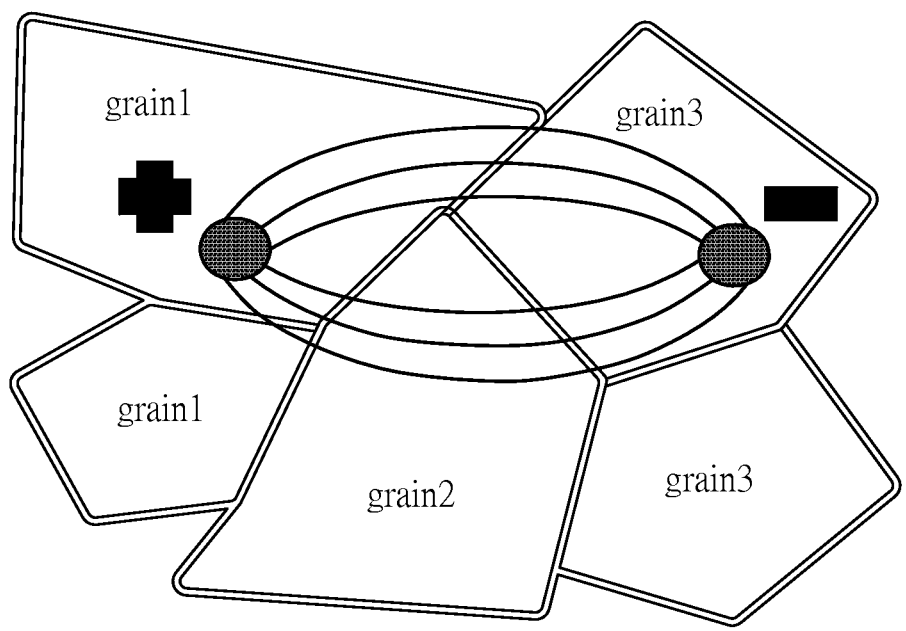
FIG. 8 is a schematic diagram of locating the surface grain of the under-test object by using different conductivities of different materials according to an embodiment of the invention.

When the above-mentioned conductive probes 1, 1a implement the micro-region measurement, the measurement position can be located by using the electric fields or conductivities of different materials or by using the profile, mechanical property or dynamic property of the under-test object. Then, the electric measurement of the partial surface can be achieved. As shown in FIG. 8 for example, the grains of the surface of the under-test object are located by using different conductivities of different materials, and then the impedance measurement of the partial surface is implemented.

Figure 9:
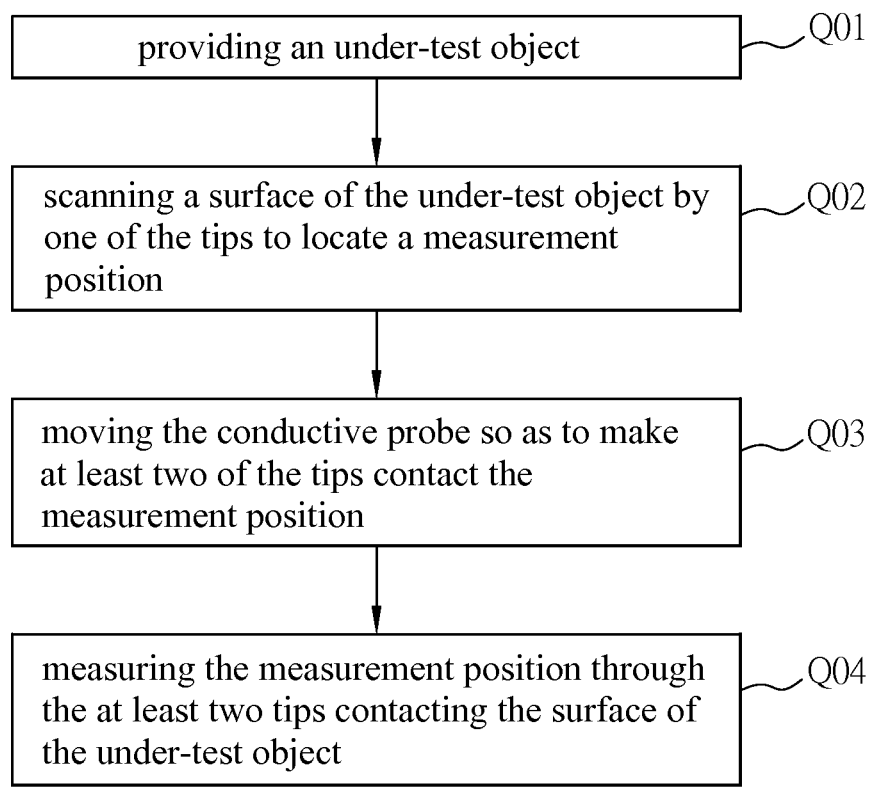
FIG. 9 is a schematic flowchart of the measurement method using the multi-electrode conductive probe according to an embodiment of the invention.

FIG. 9 is a schematic flowchart of the measurement method using the multi-electrode conductive probe according to an embodiment of the invention. Herein, the multi-electrode conductive probe can be the conductive probe 1 or 1a or their variation, and the technical features thereof can be comprehended by referring to the above illustration so they are not described here for conciseness. The following measurement method is not limited to the application of AFM, and it also can be applied to the micro-region property measurement, such as the electric analysis of the micro-region of the material interface of the Li-ion battery.

As shown in FIG. 9, the measurement method using the multi-electrode conductive probe includes the steps Q01~Q04. In the step Q01, an under-test object is provided.

Then, the step Q02 is to scan a surface of the under-test object by one of the tips to locate a measurement position. In the step Q02, the measurement position can be located by using the profile, mechanical property or dynamic property of the under-test object in some embodiments. The mechanical or dynamic properties include, for example, viscosity, hardness, coefficient of elasticity, deformation quantity or resilience. Moreover, in the step of locating the position, the tip for locating the position needn't be provided with electricity, and the tip can contact or doesn't contact the under-test object or can intermittently contact (i.e. dynamically contact) the surface of the under-test object. Otherwise, in some embodiments, the measurement position can be located by using the electric fields or conductivities of different materials on the surface of the under-test object. In such case, the tip for locating the position needs to be provided with electricity. Besides, when the measurement position is located by the electric field, the tip for locating the position is non-contact type, but when the measurement position is located by the conductivity, the tip for locating the position needs to contact the under-test object. To be noted, in some embodiments, before locating the position, the under-test object may be processed by a surface treatment. The surface treatment can include an etching used to make different microstructures show different profiles, or can include lapping, polishing, tagging (by the functional group with particular molecule), oxidization (or the like chemical reaction) or magnetization.

After locating the measurement position, the step Q03 is to move the conductive probe so as to make at least two of the tips contact the measurement position. The number of the tips for contacting the measurement position can be two or more, which is not limited herein. Moreover, the tips for contacting the measurement position can include the above-mentioned tip for the positioning and scanning.

The step Q04 is to measure the measurement position through the at least two tips contacting the surface of the under-test object. Herein, when the measurement is implemented, the two electrodes of the conductive layer of the base need to be supplied with electricity, so that a voltage difference is applied to the at least two tips contacting the surface of the under-test object, and therefore the at least two tips and the measurement position can form a current loop. Thereby, the electric measurement can be achieved. The micro-region properties for the measurement can include current, voltage, impedance, tunneling current, sheet resistance, current-voltage (I-V), capacitance-voltage (C-V), cyclic voltammetry (CV), contact potential difference (CPD), work function, etc.

Figure 10A:
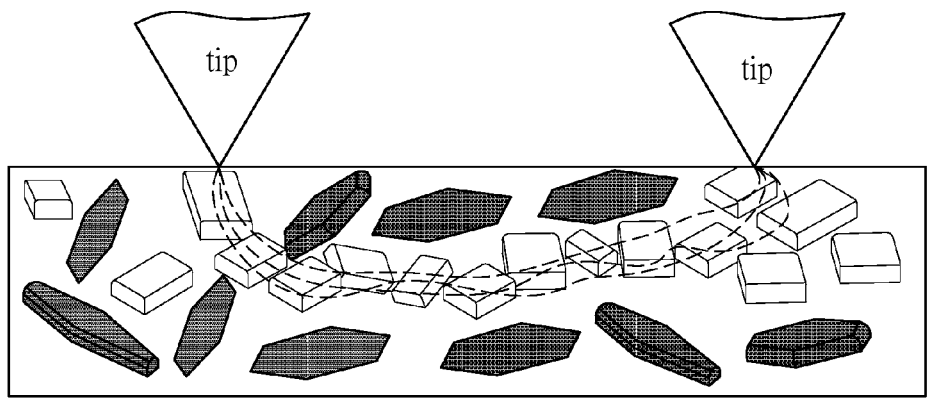
FIGS. 10A and 10B are schematic diagrams showing the path of the current flowing through $Si_3N_4$-based composite ceramic material.
Figure 10B:
Figure 10B:
Figure 10B:
Figure 10B:
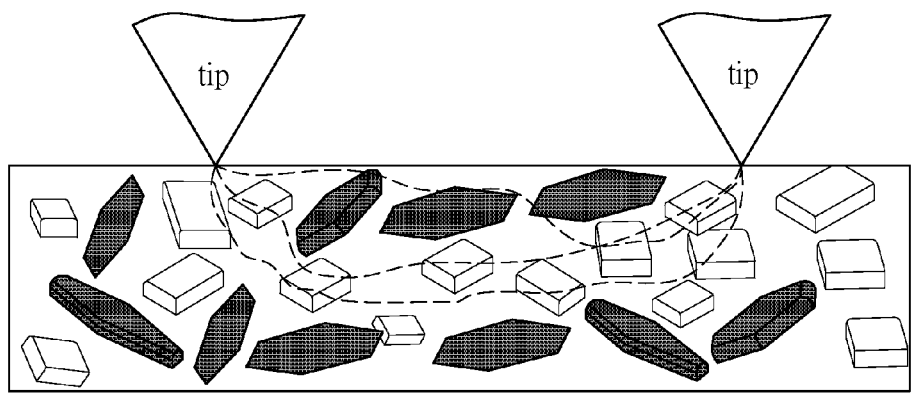
Figure 10C:
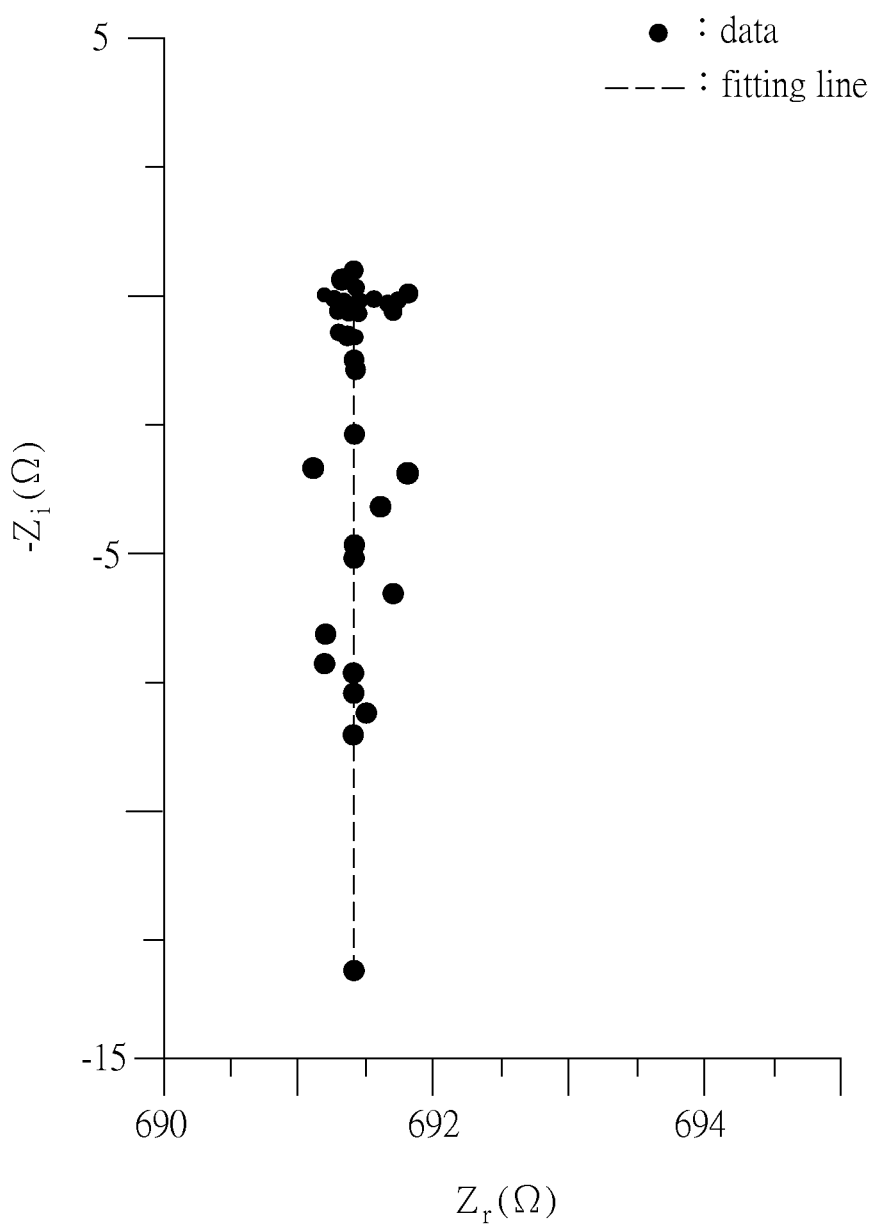
FIGS. 10C and 10D are schematic diagrams showing the inductive characteristic and capacitive characteristic which are obtained by the measurements of FIGS. 10A and 10B, respectively.
Figure 10D:
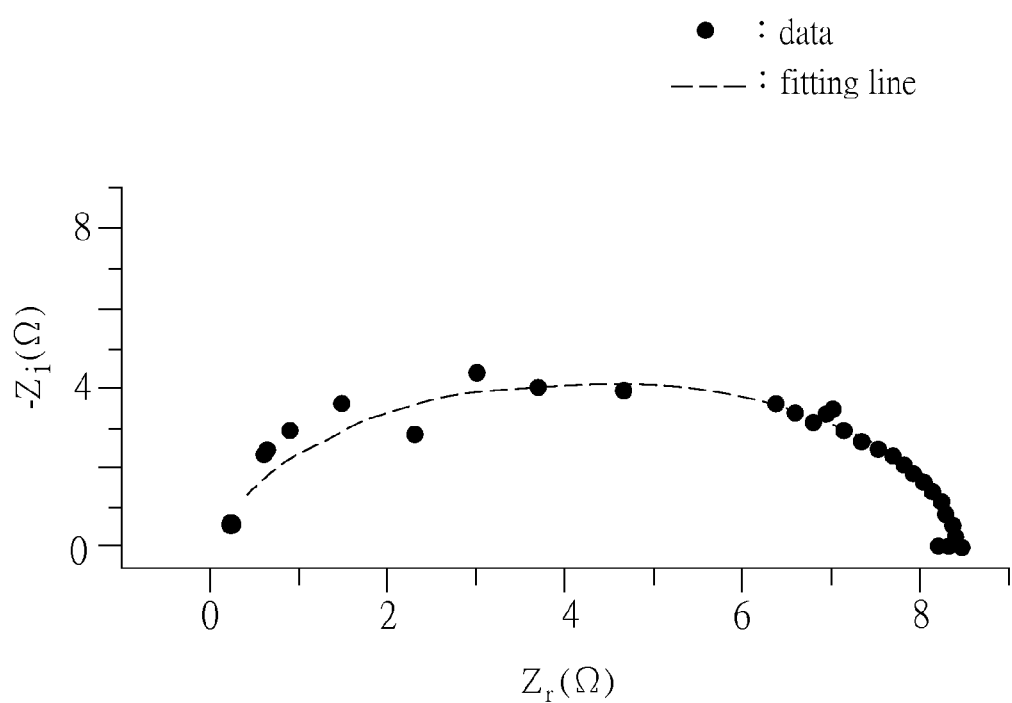

FIGS. 10A to 10D are schematic diagrams showing the measurement method using the multi-electrode conductive probe according to an embodiment of the invention. FIGS. 10A and 10B are schematic diagrams showing the path of the current flowing through $Si_3N_4$-based composite ceramic material, and FIGS. 10C and 10D are schematic diagrams showing the inductive characteristic and capacitive characteristic which are obtained by the measurements of FIGS. 10A and 10B, respectively.

By practically applying the multi-electrode conductive probe of the invention to the electric analysis of the $Si_3N_4$-based composite ceramic material, it can be demonstrated that the multi-electrode conductive probe and the measurement method using the same surely can implement the micro-region property measurements of different regions. According to the measuring result, the path of the current inside the $Si_3N_4$-based composite ceramic material can be inferred. In FIG. 10A, since the measured impedance is lower, the current can flow through the conductive TiC phase. In FIG. 10B, since the measured impedance is higher, it can be inferred that the current flows through the phase of higher impedance.

Furthermore, in the conventional art, for example, the measurement of the bulk resistance of the Li-ion battery will make the current flow through the entire battery and the measured impedance encompasses the all interfaces of the battery. So, it will be very difficult to establish the corresponding equivalent circuit for each interface. However, when the multi-electrode conductive probe of the invention is used to measure the impedance of the electrode interface of the Li-ion battery, the current won't flow through the entire battery. Besides, since the distance between the two tips is just about ten micrometers, the capability of distinguishing the electric difference between the electrode material micro-regions can be achieved. Therefore, the measurement and analysis also can be applied to the conductive agent and adhesive agent which are added in the electrode material.

Moreover, in the conventional art, in order to draw out the circuit from the conductive layer (electrode) of the multi-electrode conductive probe, an aluminum wire bonding equipment is generally used to bond the aluminum wire to the two conductive electrodes of the probe rear chip (i.e. the base) by the ultrasonic soldering. Besides, an inclined angle is formed on the probe holder of the AFM so that the conductive probe can more easily contact the under-test object during the probe application. However, due to such design, it also increase the difficulty of the ultrasonic bonding a lot. When the ultrasonic bonding is implemented, it may need several times of operations just to bond the circuit onto the holder having the inclined angle. However, each operation will make the steel mouth of the bonding equipment collide the location to be bonded, so that the conductive coated layer of the rear chip of the conductive probe will peel off due to such collision. Consequently, it may lose the conductive effect of the conductive probe and also increase the surface roughness of the bonded location and therefore increase the difficulty of the bonding.

Moreover, the rear chip of the multi-electrode conductive probe needs a connecting circuit and the probe can't be fixed to the probe holder by an elastic sheet whereas a commercial probe can be fixed likewise. Therefore, in the installation of the probe, the instant cement (such as Ethyl cyanoacrylate, ECA) is generally used for fixing the probe. However, the probe may be shifted in the position during the fixing due to the human operational factor, and this will affect the reflective direction of the laser beam hitting the cantilever (i.e. the support element) and the sensor may not receive the laser signal therefore. If this situation occurs, the probe needs to be unloaded and then reloaded. The probe can be unloaded by using acetone dissolving the instant cement. However, in the practical operation, the acetone can't completely dissolve the instant cement and the probe is also not easy to be unloaded even by using a tool (e.g. tweezers). Besides, because the probe holder just exposes a little portion of the conductive probe that is adjacent to the cantilever, the chip exposed from the front end may be broken due to the too small point of application when the tweezers is used to unload the probe. Moreover, the cantilever (support element) also may be hit and thus be broken.

Figure 11A:
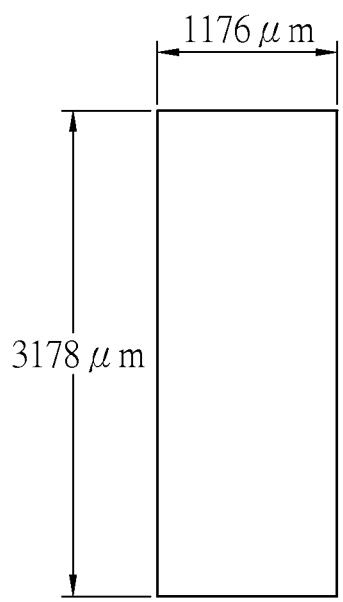
FIG. 11A is a schematic diagram of the base of a conductive probe according to an embodiment of the invention.
Figure 11B:
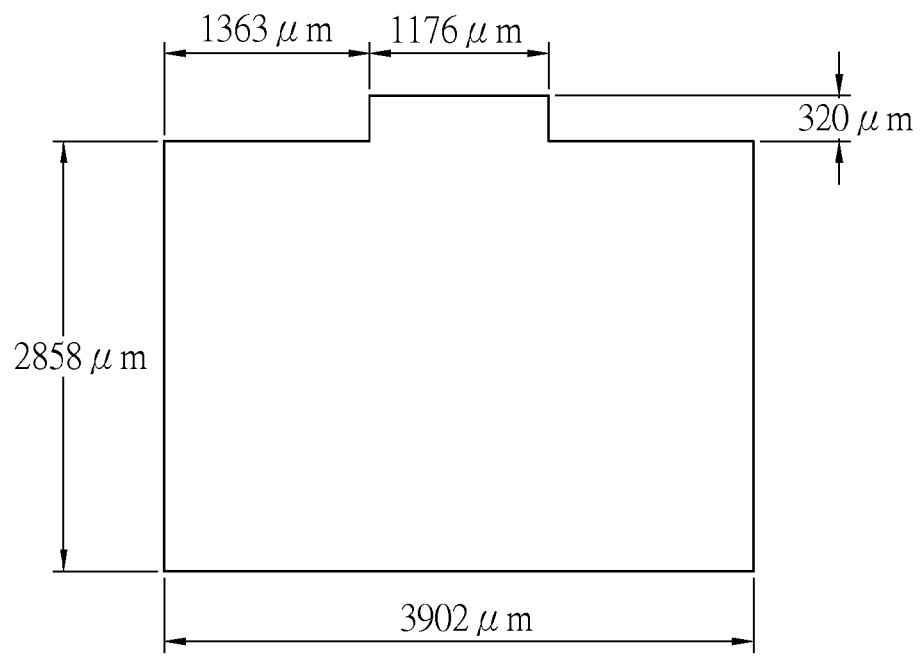
FIG. 11B is a schematic diagram of the base of a conductive probe according to another embodiment of the invention.

Therefore, in some embodiments, in order to make the circuit connection easier, the size of the base (rear chip) of the conductive probe can be increased, as shown in FIGS. 11A and 11B. FIG. 11A is a schematic diagram of the base of a conductive probe according to an embodiment of the invention, and FIG. 11B is a schematic diagram of the base of a conductive probe according to another embodiment of the invention. To be noted, the dimensions shown in FIGS. 11A and 11B are just for the illustrative purpose but not for limiting the scope of the invention.

In FIG. 11B, the width of the base (rear chip) is increased from 1176 μm as shown in FIG. 11A to 3902 μm as shown in FIG. 11B, so that the area of the base in FIG. 11B is increased and becomes 308% of the area in FIG. 11A. The larger area of the base means the area for the circuit connection is considerably increased and the difficulty of bonding is reduced. In FIG. 11B, the width of the base is larger than that of the AFM probe holder. Therefore, in comparison with the above-mentioned case where the conductive probe needs to be unloaded and reloaded if found the position shift and that can't receive the laser signal in the installation of the conductive probe, in the design of FIG. 11B the tool needn't approach the location of the cantilever (support element) too much when unloading the conductive probe so the probability that the cantilever or rear chip is broken can be reduced a lot. Besides, since the size of the base is increased, the conductive probe can be installed to a lower-level manipulator. In such case, when the measurement and the probe application are implemented, the shift of the cantilever that can be observed by an optical microscope can be used to determine if the tip contacts the surface of the under-test object. Therefore, the increment of the rear chip of the conductive probe can allow the use of the conductive probe not to be limited to the holder of the AFM. Besides, when the conductive probe is installed to the three-axis manipulator and the observation of the optical microscope is provided, the electric measurement can be achieved by the probe application. Therefore, the application platform of the multi-electrode probe can be extended in type and the applicability of the multi-electrode conductive probe can be thus increased.

Summarily, in the multi-electrode conductive probe and the manufacturing method of insulating trenches thereof of the invention, the protrusions of the conductive probe are configured on the surface in a spacing manner, and an insulating trench is disposed between the two adjacent protrusions. The conductive layer covers the surface of the base, the protrusions, the support elements and the tips. The portions of the conductive layer on the two adjacent support elements are electrically insulated from each other by at least an insulating trench. Thereby, an additional mask is not required to define the pattern of the conductive layer of the conductive probe of this invention, but the portions of the conductive layer on the tips can be electrically insulated from each other by the insulating trenches. Therefore, through the design of the insulating trenches of this invention, the conductive electrodes can be electrically insulated from each other so that the process scan be simplified and the production yield of the probe can be enhanced, and besides, the number of the masks can be decreased so that the production cost can be reduced.

Furthermore, in the measurement method using the multi-electrode conductive probe of the invention, one of the tips is used to scan the surface of the under-test object to locate the measurement position, at least two of the tips are made contact the measurement position, and the measurement position is measured by the at least two tips contacting the surface of the under-test object. Thereby, this invention not only can implement the electric measurement to the surface of the micro-region, but also, more importantly, can increase the applicability of the conductive probe, without only applied to AFM.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A conductive probe, comprising:
   a base having a surface and a plurality of protrusions, wherein the protrusions are configured on the surface in a spacing manner and an insulating trench is disposed between the two adjacent protrusions;
   a plurality of support elements disposed at the base and protruding from the base;
   a plurality of tips disposed on the end of the support elements away from the base; and
   a conductive layer covering the surface of the base, the protrusions, the support elements and the tips,
   wherein portions of the conductive layer on the two adjacent support elements are electrically insulated from each other by at least an insulating trench.

2. The conductive probe as recited in claim 1, wherein the conductive layer covers a bottom of each of the insulating trenches.

3. The conductive probe as recited in claim 1, wherein each of the protrusions protrudes from the base.

4. The conductive probe as recited in claim 1, wherein the insulating trench is formed by a dry etching process or a wet etching process.

5. The conductive probe as recited in claim 1, wherein the support elements protruding from the base are disposed side by side or in an encircling manner.

6. The conductive probe as recited in claim 1, wherein the height of one of the tips is greater than that of another tip.

7. The conductive probe as recited in claim 1, wherein one of the support elements is bent towards the direction of the tip in comparison with another support element.

8. The conductive probe as recited in claim 1, wherein the sum of the heights of one of the support elements and the tip thereof is greater than that of the another support element and the tip thereof.

9. The conductive probe as recited in claim 1, wherein the distance from one of the tips to the base is greater than that from another tip to the base.

10. The conductive probe as recited in claim 1, further comprising:
   a buffer layer disposed on the protrusions; and
   a mask layer disposed between the buffer layer and the conductive layer.

\* \* \* \* \*